United States Patent
Han

(10) Patent No.: US 8,647,929 B2
(45) Date of Patent: Feb. 11, 2014

(54) SEMICONDUCTOR DEVICES AND METHODS OF MANUFACTURING THEREOF

(75) Inventor: Jin-Ping Han, Fishkill, NY (US)

(73) Assignee: Infineon Technologies AG, Neubiberg (DE)

( * ) Notice: Subject to any disclaimer, the term of this patent is extended or adjusted under 35 U.S.C. 154(b) by 280 days.

(21) Appl. No.: 12/702,443

(22) Filed: Feb. 9, 2010

(65) Prior Publication Data
US 2010/0136761 A1 Jun. 3, 2010

Related U.S. Application Data

(62) Division of application No. 11/371,544, filed on Mar. 9, 2006, now Pat. No. 7,696,019.

(51) Int. Cl.
*H01L 21/00* (2006.01)

(52) U.S. Cl.
USPC ............ 438/149; 438/41; 438/44; 438/269; 438/358; 438/360; 257/E21.092; 257/E21.09; 257/E21.097; 257/E21.461; 257/E21.43

(58) Field of Classification Search
USPC ............ 438/149, 41, 44, 269, 358, 360, 429, 438/300, 299, 301; 257/E21.092, E21.09, 257/E21.097, E21.158, E21.461, E21.467, 257/E21.562, 213, E21.385, E21.42, 257/E21.43
See application file for complete search history.

(56) References Cited

U.S. PATENT DOCUMENTS

| | | | | |
|---|---|---|---|---|
| 4,566,171 A * | 1/1986 | Nelson et al. | ............ | 438/40 |
| 5,795,808 A * | 8/1998 | Park | ............ | 438/301 |
| 6,214,679 B1 * | 4/2001 | Murthy et al. | ............ | 438/299 |
| 6,274,894 B1 * | 8/2001 | Wieczorek et al. | ............ | 257/192 |
| 6,593,217 B1 * | 7/2003 | Fujisawa | ............ | 438/495 |
| 6,657,223 B1 * | 12/2003 | Wang et al. | ............ | 257/19 |
| 6,867,428 B1 * | 3/2005 | Besser et al. | ............ | 257/19 |
| 6,891,192 B2 * | 5/2005 | Chen et al. | ............ | 257/49 |
| 7,078,742 B2 * | 7/2006 | Lin et al. | ............ | 257/190 |
| 7,112,495 B2 * | 9/2006 | Ko et al. | ............ | 438/300 |
| 7,135,724 B2 * | 11/2006 | Chen et al. | ............ | 257/288 |
| 7,195,983 B2 * | 3/2007 | Chindalore et al. | ............ | 438/301 |
| 7,226,820 B2 * | 6/2007 | Zhang et al. | ............ | 438/149 |
| 7,339,215 B2 * | 3/2008 | Chidambaram | ............ | 257/288 |
| 7,405,131 B2 * | 7/2008 | Chong et al. | ............ | 438/300 |
| 7,534,689 B2 * | 5/2009 | Pal et al. | ............ | 438/300 |
| 7,605,407 B2 * | 10/2009 | Wang | ............ | 257/191 |
| 7,612,389 B2 * | 11/2009 | Lin et al. | ............ | 257/190 |
| 7,646,068 B2 * | 1/2010 | Ko et al. | ............ | 257/379 |
| 7,649,232 B2 * | 1/2010 | Tamura et al. | ............ | 257/383 |
| 7,741,220 B2 * | 6/2010 | Iinuma | ............ | 438/682 |
| 7,755,114 B2 * | 7/2010 | Tsuchiaki | ............ | 257/288 |
| 7,816,261 B2 * | 10/2010 | Zhu et al. | ............ | 438/664 |
| 7,939,399 B2 * | 5/2011 | Mowry et al. | ............ | 438/199 |
| 2002/0158303 A1 * | 10/2002 | Kuroi et al. | ............ | 257/510 |
| 2003/0057439 A1 * | 3/2003 | Fitzgerald | ............ | 257/192 |

(Continued)

*Primary Examiner* — N Drew Richards
*Assistant Examiner* — Ankush Singal
(74) *Attorney, Agent, or Firm* — Slater & Matsil, L.L.P.

(57) ABSTRACT

Semiconductor devices and methods of manufacturing thereof are disclosed. A preferred embodiment includes a semiconductor device comprising a workpiece, the workpiece including a first region and a second region proximate the first region. A first material is disposed in the first region, and at least one region of a second material is disposed within the first material in the first region, the second material comprising a different material than the first material. The at least one region of the second material increases a first stress of the first region.

27 Claims, 5 Drawing Sheets

(56) References Cited

U.S. PATENT DOCUMENTS

| | | | |
|---|---|---|---|
| 2003/0111699 A1* | 6/2003 | Wasshuber et al. | 257/414 |
| 2003/0146458 A1* | 8/2003 | Horiuchi et al. | 257/288 |
| 2004/0173815 A1* | 9/2004 | Yeo et al. | 257/192 |
| 2005/0029601 A1* | 2/2005 | Chen et al. | 257/369 |
| 2005/0032327 A1* | 2/2005 | Ohnishi et al. | 438/424 |
| 2005/0035409 A1* | 2/2005 | Ko et al. | 257/350 |
| 2005/0082522 A1* | 4/2005 | Huang et al. | 257/19 |
| 2005/0170594 A1* | 8/2005 | Yeo et al. | 438/300 |
| 2005/0205896 A1* | 9/2005 | Li et al. | 257/213 |
| 2005/0260807 A1* | 11/2005 | Orlowski et al. | 438/197 |
| 2005/0280098 A1 | 12/2005 | Shin et al. | |
| 2005/0285187 A1* | 12/2005 | Bryant et al. | 257/335 |
| 2005/0285193 A1* | 12/2005 | Lee et al. | 257/347 |
| 2006/0011990 A1* | 1/2006 | Furukawa et al. | 257/377 |
| 2006/0043482 A1* | 3/2006 | Burnett et al. | 257/344 |
| 2006/0084235 A1* | 4/2006 | Barr et al. | 438/300 |
| 2006/0134873 A1* | 6/2006 | Koontz | 438/301 |
| 2006/0148220 A1* | 7/2006 | Lindert et al. | 438/514 |
| 2006/0172511 A1* | 8/2006 | Kammler et al. | 438/481 |
| 2006/0189053 A1* | 8/2006 | Wang et al. | 438/197 |
| 2006/0214236 A1* | 9/2006 | Chien | 257/387 |
| 2006/0228842 A1* | 10/2006 | Zhang et al. | 438/184 |
| 2006/0237746 A1* | 10/2006 | Orlowski et al. | 257/192 |
| 2007/0020864 A1* | 1/2007 | Chong et al. | 438/300 |
| 2007/0032026 A1* | 2/2007 | Ong et al. | 438/301 |
| 2007/0057287 A1* | 3/2007 | Lin et al. | 257/190 |
| 2007/0057324 A1* | 3/2007 | Tews et al. | 257/347 |
| 2007/0166890 A1* | 7/2007 | Cheng et al. | 438/149 |
| 2007/0190731 A1* | 8/2007 | Chen et al. | 438/299 |
| 2007/0190741 A1* | 8/2007 | Lindsay | 438/424 |

* cited by examiner

US 8,647,929 B2

SEMICONDUCTOR DEVICES AND METHODS OF MANUFACTURING THEREOF

This is a divisional application of U.S. application Ser. No. 11/371,544, entitled "Semiconductor Devices and Methods of Manufacturing Thereof," which was filed on Mar. 9, 2006 now U.S. Pat. No. 7,696,019 and is incorporated herein by reference.

TECHNICAL FIELD

The present invention relates generally to the fabrication of semiconductor devices, and more particularly to increasing the stress of material layers of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). A transistor typically includes a gate dielectric disposed over a channel region, and a gate formed over the gate dielectric. A source region and a drain region are formed on either side of the channel region within a substrate or workpiece.

In complementary metal oxide semiconductor (CMOS) devices, both positive and negative channel devices are used in complementary configurations. The positive and negative channel devices of CMOS devices are typically referred to as p channel metal oxide semiconductor (PMOS) and n channel metal oxide semiconductor (NMOS) transistors. A PMOS transistor is formed in an n well (e.g., a well implanted with n type dopants) and an NMOS transistor is formed in a p well. A shallow trench isolation (STI) region is typically formed between the n well and p well of the PMOS transistor and the NMOS transistor, respectively.

In some transistor designs, it is desirable to introduce stress to the channel region to improve the transistor performance.

What are needed in the art are improved methods and structures for introducing stress in transistors and other semiconductor devices.

SUMMARY OF THE INVENTION

These and other problems are generally solved or circumvented, and technical advantages are generally achieved, by preferred embodiments of the present invention which provide novel methods of introducing stress to source and drain regions of transistors and to other regions of semiconductor devices.

In accordance with a preferred embodiment of the present invention, a semiconductor device includes a workpiece having a first region and a second region proximate the first region. A first material is disposed in the first region, and at least one region of a second material is disposed within the first material in the first region, the second material comprising a different material than the first material. The at least one region of the second material increases a first stress of the first region.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely implemented in a source and drain region of a transistor. The invention may also be applied, however, to other semiconductor applications where introducing stress to an adjacent region is desired.

Figure 1:
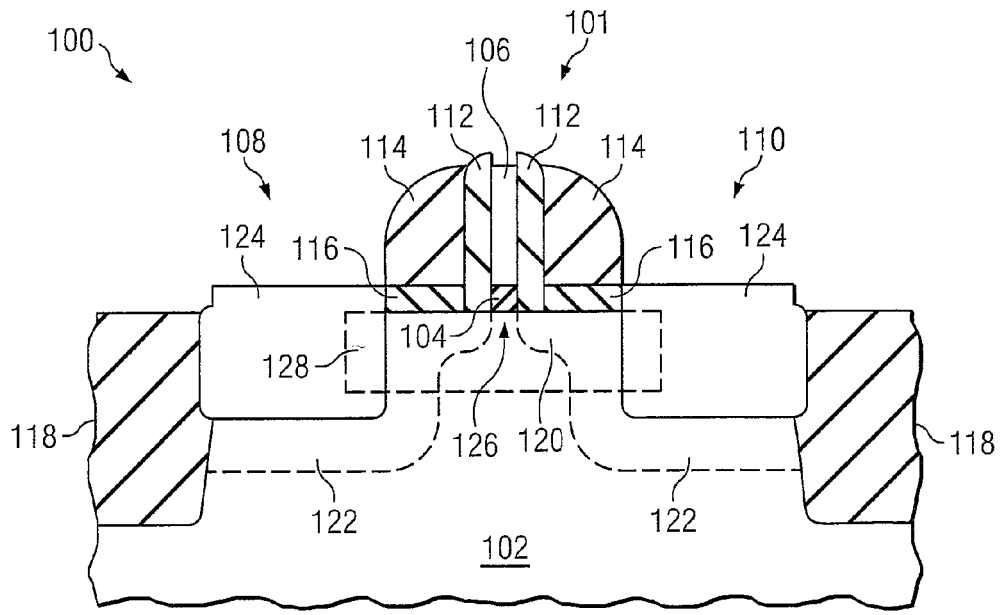
FIG. 1 shows a cross-sectional view of a prior art transistor having SiGe in the source and drain regions.

FIG. 1 shows a cross-sectional view of a prior art semiconductor device 100 including a transistor 101 having SiGe 124 formed in the source and drain regions 108 and 110. The transistor 101 is typically fabricated by providing a workpiece 102 and forming STI regions 118 in the workpiece. A gate dielectric material 104 is deposited over the workpiece 102, and a gate material 106 is deposited over the gate dielectric material 104. The gate material 106 and the gate dielectric material 104 are patterned using lithography to form a gate 106 and gate dielectric 104. The workpiece 102 is lightly doped with a dopant species to form lightly doped regions 120 in a top surface of the workpiece 102 proximate the gate 106 and gate dielectric 104.

Spacers 112/114/116 comprising insulating materials are formed on the sidewalls of the gate 106 and gate dielectric 104. The workpiece 102 may include a deep implantation of a dopant species proximate the spacers 112/114/116, as shown at 122. Exposed portions of the workpiece 102 are recessed using an etch process, and then SiGe 124 is epitaxially grown in the recesses to form the source region 108 and the drain region 110. A channel region 126 of the transistor 101 is located beneath the gate dielectric 104 between the source region 108 and the drain region 110.

Figure 2:
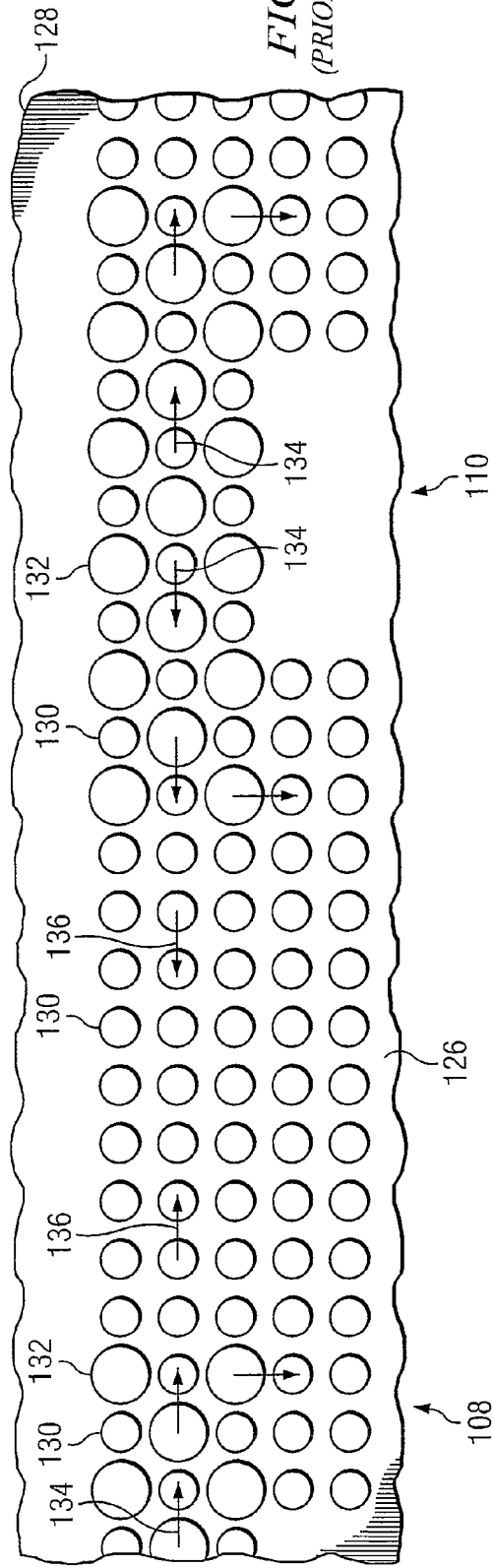
FIG. 2 shows a more detailed view of the channel region of the transistor shown in FIG. 1, illustrating the effect that the SiGe source and drain regions have on stress in the channel region of the transistor.

FIG. 2 shows a more detailed view of region 128 of the transistor 101 shown in FIG. 1, illustrating the effect that the SiGe 124 molecules in the source and drain regions 108 and 110 have on stress in the channel region 126 of the transistor 101. The channel region 126 comprises only silicon atoms 130, and the source and drain regions 108 and 110 comprise SiGe molecules comprised of silicon atoms 130 and germanium atoms 132. The germanium atoms 132 are larger than the silicon atoms 130, which creates tensile stress 134 in the source region 108 and the drain region 110, as shown. The tensile stress 134 in the source region 108 and the drain region 110 causes compressive stress 136 in the channel region 126 which is surrounded on either side by and adjacent to the source region 108 and drain region 110.

Introducing stress to the channel region 126 of a transistor 101 is advantageous in some applications, because the performance of the transistor 101 may be improved. For example, forming epitaxially grown SiGe in CMOS technology in PMOS field effect transistors (FET's) has demonstrated performance enhancement by introducing stress to the channel region. However, SiGe in the source and drain regions of transistors has exhibited stress relaxation, e.g., over time or after various anneal processes and other processing steps used to manufacture the transistors.

Thus, what are needed in the art are improved methods and structures for introducing stress to source, drain, and channel regions of transistors, and to various regions of semiconductor devices.

Embodiments of the present invention provide novel structures and methods of introducing stress to source and drain regions of transistors, which creates stress in the channel region. Embodiments of the invention may also be implemented in other applications where introducing stress to an adjacent region is desired.

Figure 3:
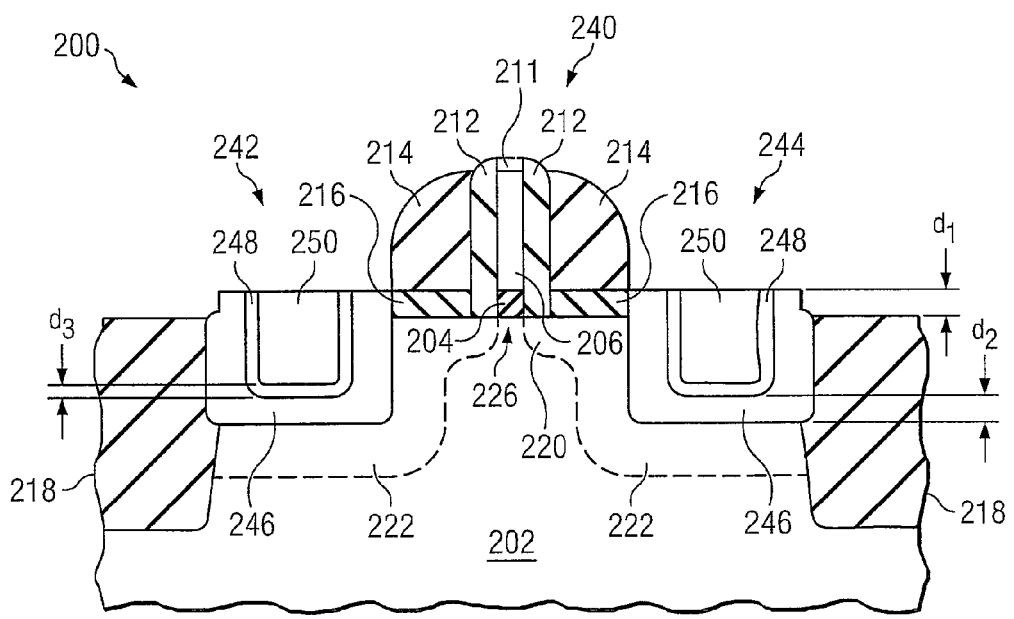
FIG. 3 is a cross-sectional view of an embodiment of the present invention, wherein the source and drain regions of a transistor comprise a first portion of a first material, a second material disposed over the first portion of the first material, and a second portion of the first material disposed over the second material.

FIG. 3 shows a cross-sectional view of a preferred embodiment of the present invention, wherein the source and drain regions 242 and 244 of a transistor 240 comprise a first portion 246 of a first material, a second material 248 disposed over the first portion 246 of the first material, and a second portion 250 of the first material disposed over the second material 248. Like numerals are used for the various elements in FIG. 3 that were used with reference to FIGS. 1 and 2. The first material (e.g., portions 246 and 250 of the first material) comprises a first stress-increasing material such as SiGe, and the second material 248 comprises a second stress-increasing material having molecules that are a different size than the molecules of the first material.

In some embodiments, the molecules of the second material 248 are larger than the molecules of the first material, so that the second material 248 increases the tensile stress of the source and drain regions 242 and 244. The increased tensile stress of the source and drain regions 242 and 244 increases the compressive stress in the channel region 226. The second material 248 comprises an insertion layer disposed within the first material 246/250 that is deposited, epitaxially grown, or implanted.

The second material 248 preferably comprises at least one region of material formed within the first material 246/250, and the second material 248 may comprise a variety of shapes. For example, the at least one region of the second material 248 may comprise a structure comprising a vertically-extending fin or plug disposed partially or completely through the source region and the drain region; a horizontally-extending fin or plug disposed partially or completely through the source region and the drain region; a liner disposed over a first portion of the first material disposed within the workpiece, wherein a second portion of the first material is disposed over the liner; or combinations thereof, which will be further described herein with references to FIGS. 3, 4, and 6 through 10. Alternatively, the second material 248 may comprise other shapes, for example.

Referring to FIG. 3, a preferred method of fabricating a transistor 240 will next be described, wherein the second material 248 comprises a liner disposed over a first portion 246 of the first material disposed within the workpiece 202, and wherein a second portion 250 of the first material is disposed over the liner 248. First, a workpiece 202 is provided. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, or SiC, as examples, may be used in place of silicon, as examples. The workpiece 202 may comprise a silicon-on-insulator (SOI) substrate, for example.

STI regions 218 may be formed in the workpiece, e.g., by patterning the workpiece 202 using lithography, e.g., by depositing a layer of photoresist over the workpiece 202, patterning the layer of photoresist using a lithography mask, removing portions of the layer of photoresist, and using the layer of photoresist as a mask while exposed portions of the workpiece 202 are etched away using an etch process. The patterned portions of the workpiece 202 are filled with an insulating material such as silicon dioxide to form STI regions 218. The STI regions 218 are preferably formed before the formation of the transistor 240 in some embodiments, although alternatively, the STI region 218 may be formed after the transistor 240 is formed. In some applications, STI regions 218 may not be required, for example, not shown.

A gate dielectric material 204 comprising an insulator such as silicon dioxide, silicon nitride, or a low or high dielectric constant (k) material, or other insulating material is deposited over the workpiece 202, and a gate material 206 is deposited over the gate dielectric material 204. The gate dielectric material 204 may comprise a thickness of about 30 to 250 Angstroms, as an example, although alternatively, the gate dielectric material 204 may comprise other dimensions. The gate material 206 preferably comprises a semiconductor material such as silicon or polysilicon, as examples, although other semiconductor materials and conductors may also be used. The gate material 206 may comprise a thickness of about 1,000 to 2,000 Angstroms, as an example, although alternatively, the gate material 206 may comprise other dimensions. The gate material 206 and the gate dielectric material 204 are patterned using lithography to form a gate 206 and gate dielectric 204. The gate 206 is also referred to herein as a gate electrode.

Optionally, exposed portions of the workpiece 202 may be lightly doped with a dopant species to form lightly doped regions 220 proximate the gate 206 and gate dielectric 204 within an upper portion of the workpiece 202, as shown. A spacer 212/214/216 comprising insulating materials are formed on the sidewalls of the gate 206 and gate dielectric 204. The spacer 212/214/216 may comprise one or more layers of silicon oxide or silicon nitride, as examples, although alternatively, other materials may also be used.

For example, the spacer 212/214/216 may comprise a liner 216/212 comprising silicon nitride or silicon oxide that is substantially conformal and covers all exposed surfaces. The spacer 212/214/216 may include an insulating material 214 formed over the liner 216/212 that comprises silicon oxide or silicon nitride. The insulating material 214 may comprise a different material than the liner 216/212, for example. The insulating material 214 and liner 216/212 may be patterned and/or etched, e.g., using an anisotropic etch process to form downwardly sloping sidewalls on the insulating material 214, as shown. A small portion of an insulating material 211, e.g., comprising a portion of the liner 216/212, shown in phantom, is preferably left disposed over the top surface of the gate 206 and removed later in the manufacturing process. The insulating material 211 over the gate 206 may comprise a thickness of about 100 to 600 Angstroms, for example, although alternatively, the insulating material 211 may comprise other dimensions.

After the formation of the sidewall spacers 212/214/216, optionally, the workpiece 202 may be implanted with a deep implantation of a dopant species, as shown at 222, in the source region 242 and the drain region 244 proximate the spacer 212/214/216.

Next, in accordance with a preferred embodiment of the present invention, exposed portions of the workpiece 202 are recessed using an etch process. A first recess is formed in the source region 242 and a second recess is formed in the drain region 244. The first recess and the second recess preferably comprise a depth beneath the top surface of the workpiece 202 of about 80 to 110 nm, and more preferably comprises a depth of about 200 nm or less, for example. Alternatively, the amount of the recesses may comprise other dimensions.

The first recess and the second recess may comprise a substantially square or rectangular shape within the workpiece 202, as shown, in some embodiments. In other embodiments, the first recess and the second recess may comprise a round shape, an oval shape, or undercut in a symmetric or skewed shape (e.g., being wider at the bottom than at the top of the recesses), not shown.

A first portion 246 of a first material is formed in the first recess and the second recess to partially fill the first recess and the second recess. The first portion 246 of the first material is preferably formed by epitaxial growth, e.g., by exposing the recessed portions of the workpiece 202 to a gas containing the material to be grown epitaxially, which preferably comprises SiGe in one embodiment, for example. In other embodiments, the first portion 246 of the first material may be deposited, using atomic layer deposition (ALD), physical vapor deposition (PVD), chemical vapor deposition (CVD), or other deposition methods, for example.

A second material 248 is formed over the first portion 246 of the first material, as shown in FIG. 3. The second material 248 is preferably epitaxially grown over the first portion 246 of the first material in some embodiments, although alternatively, the second material 248 may be deposited using ALD, PVD, CVD, or other deposition method, for example. The second material 248 preferably partially fills the first recess and the second recess of the source region 242 and the drain region 244, respectively.

A second portion 250 of the first material is formed over the second material 248 to fill the first recess and the second recess in the source region 242 and the drain region 244, as shown. The second portion 250 of the first material preferably comprises the same material as the first portion 246 of the first material, for example. The second portion 250 of the first material is preferably formed by epitaxial growth, and alternatively may be formed using ALD, PVD, CVD, or other deposition methods.

In a preferred embodiment, the first portion 246 of the first material, the second material 248, and the second portion 250 of the first material are formed epitaxially so that the materials only form in the recessed portion of the workpiece 202, e.g., on the exposed workpiece 202. Because they preferably comprise semiconductive materials, advantageously, the first material 246/250 and second material 248 will not epitaxially grow over the insulating materials of the STI regions 218, the spacer 212/214/216, or the spacer 211 on top of the gate 206. In other embodiments, however, the first portion 246 of the first material, the second material 248, and the second portion 250 of the first material may be deposited to cover the entire workpiece 202 and are later removed using lithography from undesired areas, such as over the STI regions 218, the spacer 212/214/216, or the spacer 211 on top of the gate 206, for example.

The first material (e.g., portions 246 and 250 of the first material) comprises a first stress-increasing material. The first material 246/250 preferably comprises a semiconductive material, and more preferably comprises SiGe in one embodiment, for example. Alternatively, the first material 246/250 may comprise other semiconductive materials.

The second material 248 comprises a second stress-increasing material. The second material 248 preferably comprises a semiconductive material that is different than the semiconductive material of the first material, for example. The second material 248 preferably comprises a material comprising molecules that have a different size than the molecules of the first material. The second material 248 preferably comprises Ge in one embodiment. Ge atoms are larger than Si atoms, and thus, inserting a layer of Ge atoms into a source region 242 and drain region 244 increases the stress, e.g., the tensile stress of the source region 242 and the drain region 244. The increased tensile stress of the source and drain regions 242 and 244 causes an increase in the compressive stress of the channel region 226 adjacent the source and drain regions 242 and 244 of the transistor 240.

The second material 248 may also comprise other semiconductive materials having different sized molecules and/or atoms than the molecules and/or atoms of the first material 246/250. For example, the second material 248 may alternatively comprise InAs, InSb, InP, or Si or other materials, which comprise molecules that are larger than atoms of the first material 246/250. In some embodiments, the second material 248 may comprise Si having a different crystalline orientation than Si of the workpiece 202, as an example, or having a different crystalline orientation than the crystalline orientation of the first portion of the first material 246. For example, the second material 248 may comprise Si having a crystalline orientation of <110>, <111>, or other orientations. In other embodiments, the second material 248 may comprise other semiconductive materials such as Ge, InAs, InSb, or InP having a different crystalline orientation than the crystalline orientation of the first portion of the first material 246, or a different crystalline orientation than the crystalline orientation of the silicon of the workpiece 202.

If the second material 248 comprises InAs or InSb, as examples, the InAs and InSb have a smaller band gap than SiGe and thus result in a reduction in the contact resistance of the source and drain regions 242 and 244, for example, which is an advantage in some applications.

Embodiments of the present invention wherein the second material 248 comprises molecules or atoms that are larger than the molecules or atoms of the first material 246/250 are particularly advantageous when implemented in the source region 242 and drain region 244 of a PMOS FET, for example, because the second material 248 increases the tensile stress of the source region 242 and drain region 244, which causes an increase in the compressive stress in the channel region 246. An increased compressive stress in the channel region 246 results in improved performance of a PMOS FET transistor 240, for example.

However, in other embodiments, the second material 248 preferably comprises molecules or atoms that are smaller than the molecules or atoms of the first material 246/250. This is particularly advantageous when implemented in the source region 242 and drain region 244 of an NMOS FET, for example, because the second material 248 increases the compressive stress of the source region 242 and drain region 244, which causes an increase in the tensile stress in the channel region 246. An increased tensile stress in the channel region 246 results in improved performance of an NMOS FET transistor 240, for example. In this embodiment, the first material 246/250 preferably comprises SiC, which may be epitaxially grown, for example, or deposited, as previously described herein, and the second material 248 preferably comprises C or other elements comprising smaller atoms and/or molecules than SiC, for example.

In one embodiment, the second material 248 may be formed within the first material 246/250 by implantation. In this embodiment, the first material 246/250 comprises a single material layer that is epitaxially grown or deposited in the first recess and the second recess of the source region 242 and the drain region 244, respectively. The second material 248 is then implanted into the first material 246/250 using an implantation process. The dose and amount of the implantation process is preferably adjusted to achieve the desired depth and shape of the second material 248 within the first material 246/250.

The first material 246/250 and the second material 248 are preferably formed within the first recess and the second recess in the source region 242 and drain region 244 to at least fill the first recess and the second recess. Preferably, in some embodiments, the first material 246/250 and the second material 248 extend above the top surface of the workpiece 202 by an amount $d_1$, as shown in FIG. 3. The dimension $d_1$ preferably comprises about 0 to 100 nm, and the dimension $d_1$ may comprise about ½ of the depth of the first and second recess within the workpiece 202 in some embodiments, as examples.

The first portion 246 of the first material preferably comprises a thickness of about 50 nm or less, although alternatively, the first portion 246 may comprise other dimensions, e.g., such as about 100 nm or less, as shown at dimension $d_2$. The second material 248 preferably comprises a thickness of about 50 nm, for example, and more preferably comprises a thickness of about 20 nm or greater in some embodiments, for example, as shown at dimension $d_3$. In the embodiment of the present invention shown, the second material 248 comprises a liner having substantially the same shape as the recess in the source and drain regions 242 and 244, and the second material 248 is spaced apart from the recessed workpiece 202 by the thickness of the first portion 246 of the first material.

Figure 10:
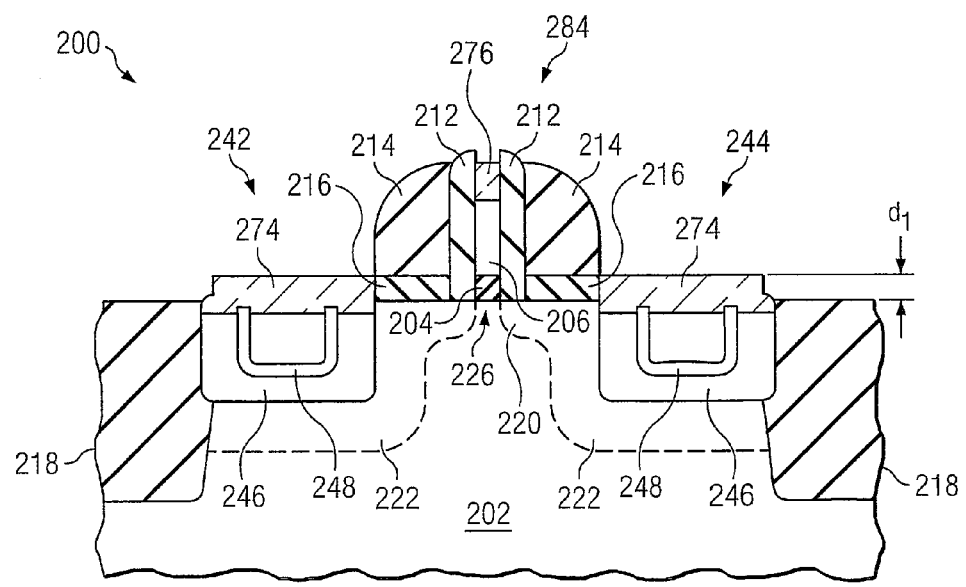
FIG. 10 shows an embodiment of the present invention, wherein the source region, the drain region, and the gate of a transistor have a silicide formed at a top surface thereof.

After the formation of the source region 242 and the drain region 244, the portion of the spacer 211 residing on top of the gate 206 is removed, and the source region 242, the drain region 244, and the gate 206 may be silicided, as shown in FIG. 10, to be described further herein. Insulating materials and conductive materials may be formed over the transistor 240 and patterned to make electrical contact to portions of the transistor 240, not shown, and the manufacturing process is continued to complete the semiconductor device 200, not shown.

Figure 4:
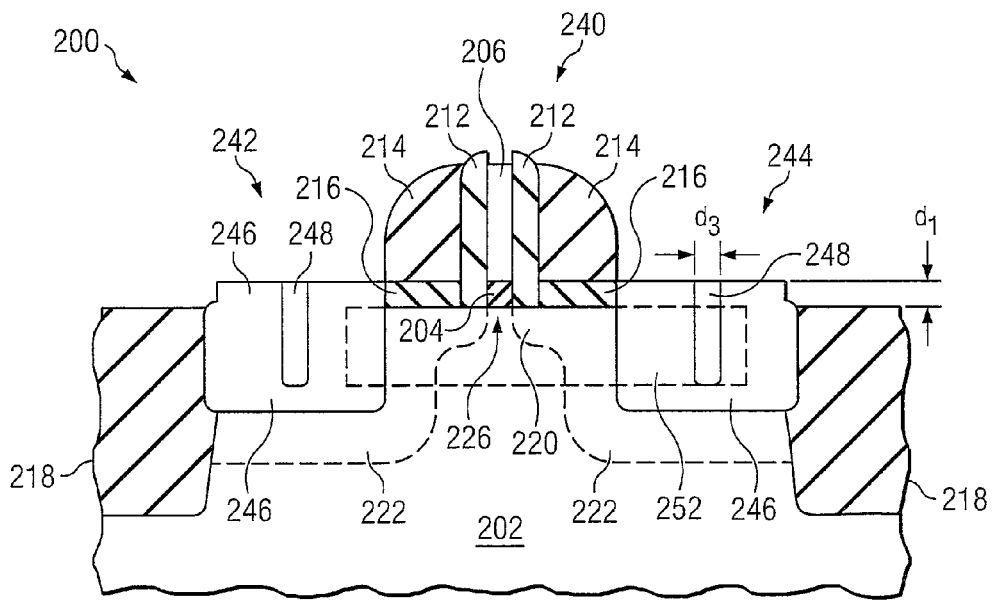
FIG. 4 is a cross-sectional view of another embodiment of the present invention, wherein the source and drain regions of a transistor comprise a first material epitaxially grown or deposited over recesses in a workpiece, and a second material disposed over the first material to fill the recesses in the workpiece.

FIG. 4 is a cross-sectional view of another embodiment of the present invention, wherein only one portion 246 of the first material is formed in the source and drain regions 242 and 244 of a transistor 240. The first portion 246 of the first material is also referred to herein as the first material 246, for example. The first material 246 may be epitaxially grown or deposited over recesses in the workpiece 202 as described with reference to FIG. 3, to partially fill the recesses. Then, a second material 248 may be epitaxially grown or deposited over the first material 246 to substantially completely fill the recesses, as shown in FIG. 4. Alternatively, the first material 246 may be grown or deposited to substantially completely fill the recesses, and the second material 248 may be implanted into the first material 246, for example.

Note that the spacer 211 on top of the gate 206 is not shown in FIGS. 4, 6, 7, and 10, although preferably, the spacer 211 is left remaining on top of the gate 206 during the formation of the source and drain regions 242 and 244 in accordance with preferred embodiments of the present invention.

In the embodiment shown in FIG. 4, the second material 248 preferably comprises a single vertically-extending fin or plug disposed partially through the source region 242 and the drain region 244. For example, the second material 248 may comprise a plug having substantially the same dimension extending into and out of the paper as the dimension $d_3$ illustrated from the left side to the right side of the second material 248 in FIG. 4. For example, the second material 248 may have a width $d_3$ of about 50 nm and a length (in and out of the paper) of about 50 nm.

Alternatively, the second material 248 may comprise a fin having a larger dimension extending into and out of the paper as the dimension illustrated from the left side to the right side of the second material 248 in FIG. 4. For example, the second material 248 may have a width $d_3$ of about 50 nm and a length (in and out of the paper) of greater than 50 nm, e.g., 100 nm to several µm. The second material 248 may extend the entire length of the channel region 226 of the transistor 240, for example.

The plug or fin of the second material 248 preferably extends from a top surface of the workpiece to a point at least past the channel region 226 of the transistor 240, for example, in some embodiments.

Figure 5:
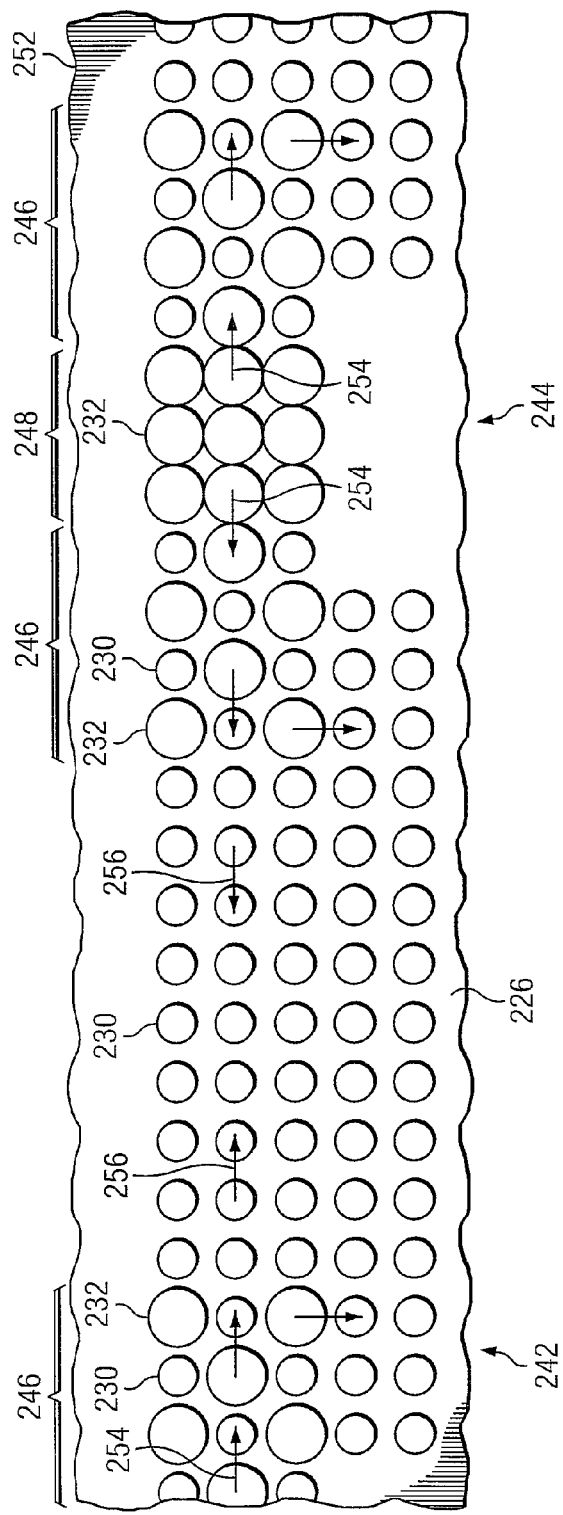
FIG. 5 shows a more detailed view of the channel region of the transistor shown in FIG. 4, illustrating the effect that the first material and second material of the novel source and drain regions of embodiments of the present invention have on stress in the channel region of the transistor.

FIG. 5 shows a more detailed view of the channel region of the transistor 240 shown in FIG. 4, illustrating the effect that the first material 246 and second material 248 of the source and drain regions 242 and 244 have on the stress 256 of the material in the channel region 226 of the transistor 240. A more detailed view of region 252 of the transistor 240 in FIG. 4 is shown in FIG. 5. An example of a second material 248 comprising Ge is illustrated in FIG. 4.

The first material 246 in the source region 242 and the drain region 244 comprise silicon atoms 230 and germanium atoms 232, wherein the germanium atoms 232 are larger than the silicon atoms 230. The Ge atoms 232 of the second material 248 are larger than the silicon atoms 230 of the first material 236 and thus increase the tensile stress 254 of the source region 242 and the drain region 244. The increased tensile stress 254 causes an increase in the compressive stress 256 in the channel region 226, as shown. Preferably, in accordance with embodiments of the present invention, a desired stress for a channel region 226 may be achieved by selecting the appropriate second material 248 material type, thickness, and method of formation of the second material 248, for example.

Alternatively, the second material 248 may comprise atoms that are smaller than Si atoms 230, for example, such as C, and the first material 246 may comprise SiC. The second material 248 causes an increase in the compressive stress in the source and drain regions 242 and 244 in this embodiment, which causes an increase in the tensile stress in the channel region 226, for example. The second material 248 may also comprise a material having a different crystalline orientation than the first material 246 and/or workpiece 202, for example.

Figure 6:
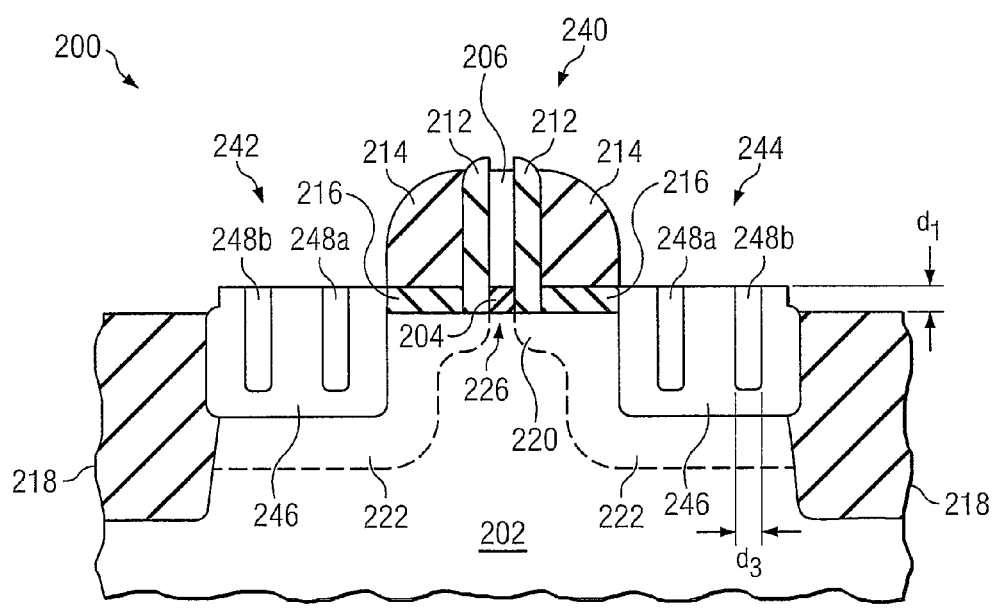
FIG. 6 shows a cross-sectional view of another embodiment of the present invention, wherein a plurality of regions of the second material are disposed within the first material in the source and drain regions of a transistor.

FIG. 6 shows a cross-sectional view of another embodiment of the present invention, wherein a plurality of regions of second material 248 are disposed within the first material 246 in the source and drain regions 242 and 244 of a transistor 240. Two regions 248a and 248b of second material 248 are shown, although alternatively, there may be two or more regions of the second material 248 formed. Each region of the second material 248 may comprise a structure comprising a vertically-extending fin or plug disposed partially through the source region 242 and the drain region 244 in this embodiment, for example. The source and drain regions 242 and 244 may be formed using epitaxial growth, deposition, or implantation, or combinations thereof, as examples.

The first material 246 may be formed by epitaxial growth or deposition, and the first material 246 may be patterned using lithography to form at least one recess in the first material 246, for example. The second material 250 may be formed by epitaxially growing or depositing the second material 250 in the at least one recess in the first material 246, for example.

Figure 7:
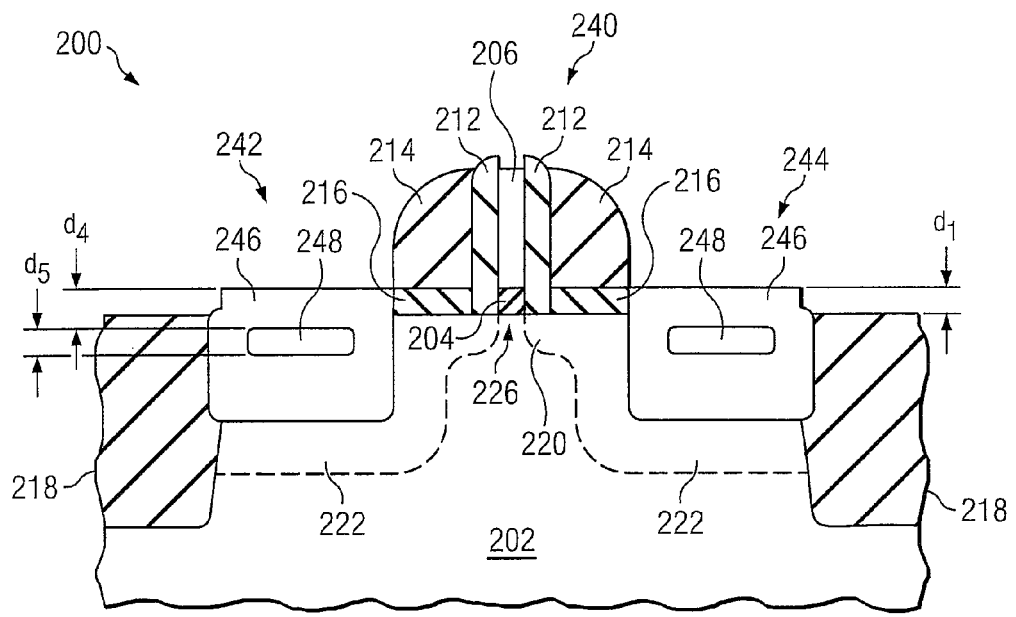
FIG. 7 shows a cross-sectional view of yet another embodiment of the present invention, wherein the second material is formed within the first material in the source and drain regions proximate the channel region of a transistor.

FIG. 7 shows a cross-sectional view of yet another embodiment of the present invention, wherein the second material 248 is formed within the first material 246 in the source and drain regions 242 and 244 proximate the channel region 226 of a transistor 240. In this embodiment, the second material 248 may comprise a structure comprising at least one (although only one is shown in FIG. 7) horizontally-extending fin or plug disposed partially (as shown) or completely through the source region 242 and the drain region 244. The second material 248 is preferably formed by implantation in this embodiment, e.g., the second material 248 is preferably implanted below the top surface of the first material 246 by a predetermined amount $d_4$. The dimension $d_4$ may comprise about 10 nm or greater, as an example. In some embodiments, the second material 248 is preferably formed proximate the channel region 226, as shown. The horizontally-positioned second material 248 may comprise a thickness or dimension $d_5$ of about 50 nm or greater, and may comprise substantially the same thickness as the channel region 226, for example. Alternatively, dimension $d_4$ and $d_5$ may comprise other dimensions, for example.

Figure 8:
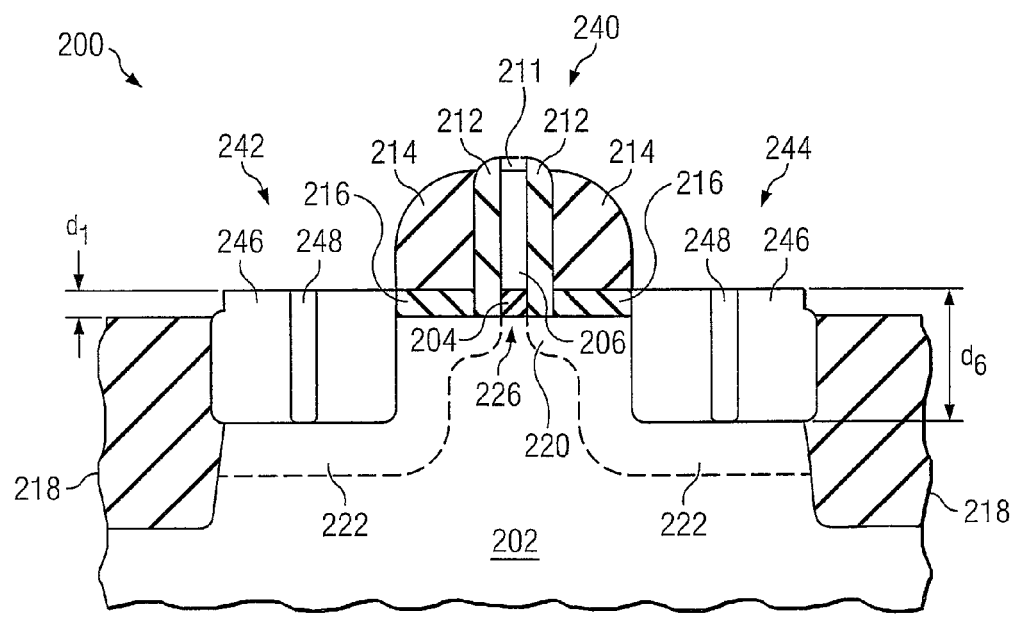
FIG. 8 shows a cross-sectional view of another embodiment of the present invention, wherein the second material is formed in the entire thickness of the first material in the source and drain regions of a transistor.

FIG. 8 shows a cross-sectional view of another embodiment of the present invention, wherein the second material 248 is formed in the entire thickness $d_6$ of the first material 246 in the source and drain regions 242 and 244 of a transistor 240. For example, the second material 248 may comprise at least one region of second material 248 comprising a vertically-extending fin or plug disposed completely through the source region 242 and the drain region 244, as shown.

The insulating liner 211 is shown in phantom in FIG. 8. The liner 211 on the top surface of the gate 206 is preferably removed so that the gate 206 will be silicided in a later manufacturing step. The insulating liner 211 protects the gate 206 during the manufacturing processes to form the first material 246/250 and the second material 248 in some embodiments. However, in the embodiment shown in FIG. 9, the liner 211 is removed before the recesses in the source region 242 and the drain region 244 are filled with the first material 246/250 and the second material 248, for example.

Figure 9:
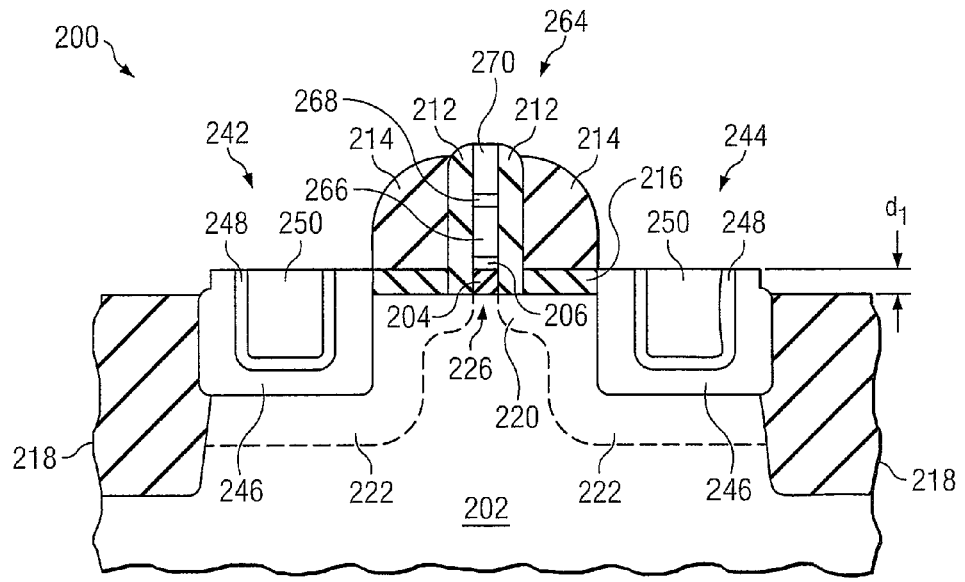
FIG. 9 shows an embodiment of the present invention, wherein the gate of a transistor also includes the first material and the second material formed in the source and drain regions.

FIG. 9 shows the embodiment of the present invention shown in FIG. 3, wherein the gate of the transistor 264 also includes the first material 266/270 (shown as 246/250 in the source and drain regions 242 and 244) and the second material 268 (shown as 248 in the source and drain regions 242 and 244) formed in the source and drain regions 242 and 244. In this embodiment, before the first recess and the second recess are formed in the source region 242 and the drain region 244, respectively, an etch process or other removal process is used to remove the liner 211 (shown in FIGS. 3 and 8 in phantom) from over the gate 206. Then an etch process is used to form the first recess and the second recess in the workpiece 202.

Because the gate 206 material also comprises silicon or polysilicon, the gate 206 is also recessed during the formation of the recesses in the source and drain regions 242 and 244 in the workpiece 202, for example, as shown in FIG. 9. Preferably, a small amount of the gate 206 material is left remaining over the gate dielectric 204, so that the gate 206 will act as a seed for epitaxial growth of the first material 246, for example.

An epitaxial growth method is used to form the first portion 246 of the first material in the recesses of the workpiece 202, during which the first portion of the first material (represented by 266 in the gate region) is also epitaxially grown on the recessed gate 206 material. An epitaxial growth method is used to form the second material 248 over the first portion 246 of the first material, during which the second material (represented by 268 in the gate region) is also epitaxially grown on top of the first portion of the first material 266 in the gate region. An epitaxial growth method is used to form the second portion 250 of the first material in the recesses of the workpiece 202 and fill the recesses, during which the second portion of the first material (represented by 270 in the gate region) is also epitaxially grown on the second material 268 in the gate region.

Advantageously, the second material 268 in the gate region increases the stress of the gate 206/266/268/270, and improves the performance of the transistor 264, in some embodiments. For example, the first material 266/270 and the second material 268 in the gate region may reduce or eliminate a polysilicon depletion effect in the transistor 240. The gate in this embodiment comprises the gate material 206, first portion 266 of the first material, second material 268, and second portion 270 of the first material, for example.

FIG. 10 shows the embodiment of the present invention shown in FIG. 3, wherein the source region 242, the drain region 244, and the gate 206 of a transistor 284 have a silicide 274 and 276 formed at a top surface thereof. The silicide 274 and 276 may be formed by depositing a layer of metal (not shown) such as Ti, Co, Ni, or NiPt as examples, although other metals may also be used, and heating the workpiece 202, not shown. The metal from the layer of metal diffuses into the semiconductive material of the source and drain regions, e.g., into the first material 246/250 and the second material 248, and into the semiconductive material of the gate 206, e.g., into the gate 206 material, forming a silicide 274 and 276, respectively, at a top surface thereof. The silicide 274 over the second material 248 may be thinner over the first material 246/250, as shown. An optional thin layer of silicon comprising a thickness of a few Angstroms (not shown) may be formed on the top surface of the source region 242 and drain region 244 (e.g., over the first material 246/250 and second material 248), and the gate 206 before the silicide formation to facilitate the silicide 274 and 276 formation, for example.

The layer of metal is then removed from the semiconductor device 200. The silicide 274 and 276 improves the conductivity and reduces the resistance of the source region 242, the drain region 244, and the gate 206, for example. A silicide 274 and 276 may also be formed on the source, drain and gate regions of the embodiments shown in FIGS. 4, 6, 7, 8, and 9, for example, not shown.

In some embodiments, the first material 246 may include a dopant species such as boron, for example, although alternatively, other dopant species may be used, such as arsenic or phosphorous, as examples, although other dopant species may also be used. The semiconductor device 200 may be heated or annealed using an additional heating or anneal step, or in another heating or anneal step used to process another material layer, for example, which causes at least a portion of the dopant species from the first material 246 into the adjacent workpiece 202, which results in the formation of the doped regions 222. Thus, a deep implantation step to form the deep implantation regions 222 may be advantageously avoided or eliminated, in accordance with embodiments of the present invention, for example.

Embodiments of the present invention may be implemented in structures other than the transistors 240, 264, and 284 shown in the drawings. For example, the novel second material 248 described herein may be inserted or formed in a first region adjacent or proximate a second region of a semiconductor device. The first material 246/250 or only 246 shown in FIGS. 3, 4, and 6 through 10 may be disposed in the first region, e.g., by epitaxial growth, deposition, or implantation, as previously described herein. At least one region of the second material 248 may be disposed within the first material 246/250 or 246 in the first region, the second material 248 comprising a different material than the first material 246/250 or 246. The at least one region of the second material 248 increases a first stress (e.g., a tensile or compressive stress) of the first region. The increased first stress in the first region 248 created by the second material 248 increases a second stress (e.g., a compressive or tensile stress) of the second region proximate the first region.

In some embodiments, for example, the first region may be disposed proximate a first side of the second region, wherein the second region comprises a second side opposite the first side. A third region may be disposed proximate the second side of the second region. The third region includes the first material 246/250 or 246 and the at least one region of the second material 248 disposed within the first material 246/250 or 246. The at least one region of the second material 248 increases a third stress of the third region. In this embodiment, for example, the first stress of the first region and the third stress of the third region increase a second stress of the second region. The first region may comprise a source region 242, the third region may comprise a drain region 244, and the third region may comprise a channel region 226, as shown in FIGS. 3, 4, and 6 through 10, although alternatively, the first region, second region, and third region may comprise other structures that would benefit from an increase in stress in the first, second, and third regions, for example.

Embodiments of the present invention include semiconductor devices 200 and transistors 240, 264, and 284 including the first material 246/250 and second material 248 described herein. Embodiments of the present invention also include methods of fabricating the semiconductor devices 200 and transistors 240, 264, and 284, for example.

Advantages of embodiments of the invention include providing novel structures and methods for increasing the stress of source and drain regions of transistors 240, 264, and 284 and other semiconductor devices. In some embodiments, the increased tensile stress in the source and drain regions 242 and 244 causes an increase in the compressive stress of the channel region 226, improving the performance of the transistors 240, 264, and 284. The stress-enhancing structures comprised of the first material 246/250 and second material 248 in these embodiments are particularly beneficial in enhancing the performance of PMOS field effect transistors (FET's), for example.

Embodiments of the present invention may also be used to enhance the performance of NMOS FET's, for example, if the second material 248 comprises a material that increases compressive stress in the source and drain regions 242 and 244, which causes an increase in tensile stress in the channel region 246. Increasing the tensile stress in the channel region 246 of an NMOS FET improves the performance of the NMOS FET, for example.

Embodiments of the present invention advantageously enhance transistor performance and reduce or eliminate poly depletion effect (PDE) and induce a well-controlled amount of stress in the channel region 226. The channel 226 stress is increased by introducing larger or smaller element layers in the source and drain regions 242 and 244, which is also advantageous because stress relaxation is reduced or prevented. The amount of increased stress introduced in the channel region 226 is well-controlled. The size of the second material 248 may be increased or decreased, depending on the amount of stress desired in the channel region 226, for example. The stress is enhanced in accordance with embodiments of the invention by introducing more lattice mismatching, e.g., in the source and drain regions 242 and 244, by the insertion of the region or regions of second material 248.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
    forming a recess in a source/drain region in a substrate, the source/drain region of the substrate being proximate a first region in the substrate;
    disposing a first stress-increasing material in the recess, the first stress-increasing material being different than the substrate;
    forming an opening in the first stress-increasing material; and
    disposing a second stress-increasing material in the opening of the first stress-increasing material in the source/drain region, the second stress-increasing material comprising a different material than the first stress-increasing material, wherein the first stress-increasing material and the second stress-increasing material in the source/drain region increase a stress of the first region.

2. The method according to claim 1, wherein the substrate comprises Si, and wherein the second stress-increasing material comprises forming a material having a different crystalline orientation than the Si of the substrate or having a different crystalline orientation of the first stress-increasing material.

3. The method according to claim 1, wherein disposing the second stress-increasing material comprises epitaxially growing, depositing, or implanting the second stress-increasing material.

4. The method according to claim 1, wherein disposing the second stress-increasing material comprises forming a material layer having a thickness of about 20 nm or greater.

5. The method according to claim 1, wherein disposing the first stress-increasing material comprises disposing SiGe.

6. The method according to claim 1, wherein disposing the second stress-increasing material comprises filling the opening with Ge, InAs, InSb, InP or Si.

7. The method according to claim 1, wherein disposing a second stress-increasing material in the opening of the first stress-increasing material comprises disposing the second stress-increasing material to a first depth, wherein the source/drain region comprises a second depth, and wherein the first depth is the same as the second depth.

8. A method of fabricating a transistor, the method comprising:
    forming a gate dielectric material over a workpiece;
    forming a gate material over the gate dielectric material;
    patterning the gate material and the gate dielectric material to form a gate and a gate dielectric;
    forming at least one spacer over sidewalls of the gate and the gate dielectric;
    removing a portion of the workpiece proximate a first side and a second side of the gate and gate dielectric to form a first recess and a second recess;
    filling at least a portion of the first recess and the second recess with a first material; and
    forming at least one region of a second material within the first material in the first recess and the second recess, wherein the first material and the at least one region of the second material in the first recess comprise a source region, and wherein the first material and the at least one region of the second material in the second recess comprise a drain region, wherein filling the at least a portion of the first recess and the second recess with the first material comprises epitaxially growing or depositing a first portion of the first material to partially fill the first recess and the second recess, wherein forming the at least one region of the second material within the first material in the first recess and the second recess comprises epitaxially growing or depositing the second material to further partially fill the first recess and the second recess, and further comprising epitaxially growing or depositing a second portion of the first material to fill the first recess and the second recess.

9. The method according to claim 8, further comprising removing a top portion of the gate, before filling the at least a portion of the first recess and the second recess with the first material, wherein epitaxially growing or depositing the first portion the first material to partially fill the first recess and the second recess further comprises forming the first material over a bottom portion of the gate, wherein forming the at least one region of the second material within the first material in the first recess and the second recess further comprises forming the second material over the first material over the bottom portion of the gate, and wherein epitaxially growing or depositing the second portion of the first material to fill the first recess and the second recess further comprises forming the first material over the second material over the bottom portion of the gate.

10. The method according to claim 8, further comprising forming a silicide on the source region, the drain region, and the gate.

11. The method according to claim 8, wherein filling the at least a portion of the first recess and the second recess with the first material comprises filling the at least a portion of the first recess and the second recess with a material including a dopant species, further comprising heating the workpiece, causing at least a portion of the dopant species to diffuse into the workpiece proximate the first material, forming a doped region in the workpiece proximate the first material.

12. A method of fabrication a source or drain of a transistor, the method comprising:
    forming a recess proximate a channel region in a semiconductor body;
    filling the recess partially with a first stress-increasing material; and
    forming a first region with a second stress-increasing material within the first stress-increasing material in the recess, wherein the first stress-increasing material fills a majority of the recess, and wherein the first stress-increasing material comprises tensile stress and the second stress-increasing material comprises compressive stress, or wherein the first stress-increasing material comprises compressive stress and the second stress-increasing material comprises tensile stress.

13. The method according to claim 12, wherein filling the recess with a first stress-increasing material comprises epitaxially growing or depositing the first stress-increasing material, patterning the first stress-increasing material to form at least one recess in the first stress-increasing material, and then either epitaxially growing or depositing the second stress-increasing material to fill the at least one recess in the first stress-increasing material.

14. The method according to claim 12, wherein forming a first region with a second stress-increasing material within the first stress-increasing material in the recess comprises forming a horizontally extending fin or plug disposed partially through the first stress-increasing material.

15. The method according to claim 12, wherein forming a first region with a second stress-increasing material within the first stress-increasing material in the recess comprises forming a vertically extending fin or plug disposed partially through the first stress-increasing material.

16. The method according to claim 12, wherein forming a first region with a second stress-increasing material within the first stress-increasing material in the recess comprises a plurality of regions of second stress-increasing material.

17. The method according to claim 12, siliciding the first stress-increasing material and the second stress-increasing material.

18. The method according to claim 12, wherein the first stress-increasing material comprises SiGe, and wherein the second stress-increasing material comprises Ge, InAs, InSb, InP or Si.

19. A method of fabricating a transistor, the method comprising:
    forming a gate dielectric material over a workpiece;
    forming a gate material over the gate dielectric material;
    patterning the gate material and the gate dielectric material to form a gate and a gate dielectric;
    forming at least one spacer over sidewalls of the gate and the gate dielectric;
    removing a portion of the workpiece proximate a first side and a second side of the gate and gate dielectric to form a first recess and a second recess;
    filling at least a portion of the first recess and the second recess with a first material; and
    forming at least one region of a second material within the first material in the first recess and the second recess, wherein the first material and the at least one region of the second material in the first recess comprise a source region, and wherein the first material and the at least one region of the second material in the second recess comprise a drain region, wherein filling the at least a portion of the first recess and the second recess with the first material comprises epitaxially growing or depositing the first material to fill the first recess and the second recess, and wherein forming the at least one region of the second material within the first material in the first recess and the second recess comprises implanting the second material into the first material.

20. The method according to claim 19, further comprising forming a silicide on the source region, the drain region, and the gate.

21. The method according to claim 19, wherein filling the at least a portion of the first recess and the second recess with the first material comprises filling the at least a portion of the first recess and the second recess with a material including a dopant species, further comprising heating the workpiece, causing at least a portion of the dopant species to diffuse into the workpiece proximate the first material, forming a doped region in the workpiece proximate the first material.

22. A method of fabrication a source or drain of a transistor, the method comprising:
    forming a recess proximate a channel region in a semiconductor body;
    filling the recess partially with a first stress-increasing material; and
    forming a first region with a second stress-increasing material within the first stress-increasing material in the recess, wherein the first stress-increasing material comprises tensile stress and the second stress-increasing material comprises compressive stress.

23. The method according to claim 22, wherein forming the first region with the second stress-increasing material comprises forming an opening in the first stress-increasing material and filling the opening in the first stress-increasing material with the second stress-increasing material.

24. A method of fabrication a source or drain of a transistor, the method comprising:
    forming a recess proximate a channel region in a semiconductor body;
    filling the recess partially with a first stress-increasing material; and
    forming a first region with a second stress-increasing material within the first stress-increasing material in the recess, wherein the first stress-increasing material comprises compressive stress and the second stress-increasing material comprises tensile stress.

25. The method according to claim 24, wherein forming the first region with the second stress-increasing material comprises forming an opening in the first stress-increasing material and filling the opening in the first stress-increasing material with the second stress-increasing material.

26. A method of fabricating a semiconductor device, the method comprising:
    forming a recess in a source/drain region in a substrate, the source/drain region of the substrate being proximate a first region in the substrate;
    disposing a first stress-increasing material in a first portion of the recess, the first stress-increasing material being different than the substrate;
    disposing a second stress-increasing material in a second portion of the recess, the second stress-increasing material comprising a different material than the first stress-increasing material; and
    disposing a third stress-increasing material in a third portion of the recess, wherein the first to third stress-increasing materials in the source/drain region increase a stress of the first region.

27. The method according to claim 26, wherein the third stress-increasing material is the same as the first stress-increasing material.

* * * * *

UNITED STATES PATENT AND TRADEMARK OFFICE
CERTIFICATE OF CORRECTION

PATENT NO. : 8,647,929 B2  
APPLICATION NO. : 12/702443  
DATED : February 11, 2014  
INVENTOR(S) : Jin-Ping Han Page 1 of 1

It is certified that error appears in the above-identified patent and that said Letters Patent is hereby corrected as shown below:

In the Claims

In Col. 13, line 45, claim 2, after "wherein" insert --disposing--.

Signed and Sealed this  
First Day of July, 2014

Michelle K. Lee  
*Deputy Director of the United States Patent and Trademark Office*